United States Patent
Miyagi et al.

(10) Patent No.: US 8,498,597 B2
(45) Date of Patent: Jul. 30, 2013

(54) BROADCAST RECEIVING APPARATUS AND METHOD OF DETECTING NOISE COMPONENTS PERFORMED BY BROADCAST RECEIVING APPARATUS

(75) Inventors: Kohta Miyagi, Kobe (JP); Kazuo Takayama, Kobe (JP); Keita Taniguchi, Kobe (JP)

(73) Assignee: Fujitsu Ten Limited, Kobe-shi (JP)

( * ) Notice: Subject to any disclaimer, the term of this patent is extended or adjusted under 35 U.S.C. 154(b) by 131 days.

(21) Appl. No.: 13/030,791

(22) Filed: Feb. 18, 2011

(65) Prior Publication Data

US 2011/0207426 A1 Aug. 25, 2011

(30) Foreign Application Priority Data

Feb. 23, 2010 (JP) ................................. 2010-037677
Jun. 16, 2010 (JP) ................................. 2010-137735

(51) Int. Cl.
*H04B 17/00* (2006.01)
(52) U.S. Cl.
USPC .......................... 455/226.1; 455/222; 455/296
(58) Field of Classification Search
USPC ................. 455/3.01, 3.02, 222, 226.1, 277.2, 455/296, 142, 143, 3.06
See application file for complete search history.

(56) References Cited

U.S. PATENT DOCUMENTS

| | | | |
|---|---|---|---|
| 3,978,412 A * | 8/1976 | Frerking | ........................ 455/222 |
| 4,356,567 A * | 10/1982 | Eguchi et al. | .............. 455/177.1 |
| 4,379,207 A | 4/1983 | Kubota | |
| 4,388,496 A | 6/1983 | Miyamoto | |
| 4,435,618 A | 3/1984 | Fujishima | |
| 4,580,286 A | 4/1986 | Richards, Jr. | |
| 4,674,121 A * | 6/1987 | Miura et al. | ..................... 381/10 |
| 4,777,659 A | 10/1988 | Lindenmeier et al. | |
| 5,263,190 A | 11/1993 | Taniguchi et al. | |
| 5,630,217 A | 5/1997 | Matsumoto | |
| 6,690,805 B1 | 2/2004 | Tsuji et al. | |

(Continued)

FOREIGN PATENT DOCUMENTS

| JP | A-63-087026 | 4/1988 |
|---|---|---|
| JP | A-63-287223 | 11/1988 |

(Continued)

OTHER PUBLICATIONS

Office Action dated Jan. 24, 2013 in related U.S. Appl. No. 13/021,159.

(Continued)

*Primary Examiner* — Sonny Trinh
(74) *Attorney, Agent, or Firm* — Oliff & Berridge, PLC

(57) ABSTRACT

To provide a broadcast receiving apparatus including an AM detector, an AM noise detector, an FM detector, an FM noise-level detector, and a threshold control unit. The AM detector performs AM detection on a broadcast signal in airwaves received by a receiving antenna that receives incoming airwaves to acquire an AM detection signal. The AM noise detector detects a signal portion, in which the AM detection signal exceeds an AM noise threshold, as an AM noise component. The FM detector performs FM detection on the broadcast signal to acquire an FM detection signal. The FM noise-level detector detects an FM noise level of the FM detection signal. When the FM noise-level detector detects the FM noise level of the FM detection signal, the threshold control unit changes setting of the AM noise threshold in the AM noise detector based on the FM noise level of the FM detection signal.

7 Claims, 13 Drawing Sheets

U.S. PATENT DOCUMENTS

| | | |
|---|---|---|
| 6,771,942 B2 | 8/2004 | Matsumoto |
| 7,668,525 B2 * | 2/2010 | Shatara et al. ............ 455/276.1 |
| 7,706,542 B2 | 4/2010 | Suganuma |
| 7,805,120 B2 | 9/2010 | Altizer |
| 2009/0286498 A1 | 11/2009 | Katayanagi |
| 2011/0201290 A1 * | 8/2011 | Miyagi et al. ............ 455/226.1 |

FOREIGN PATENT DOCUMENTS

| | | |
|---|---|---|
| JP | A-01-232831 | 9/1989 |
| JP | A-08-274663 | 10/1996 |
| JP | A-09-214370 | 8/1997 |
| JP | A-2006-191430 | 7/2006 |
| JP | A-2009-005028 | 1/2009 |

OTHER PUBLICATIONS

Mar. 27, 2013 Office Action issued in Chinese Application No. 201110048597.3 (with English Translation).

May 10, 2013 Chinese Office Action issued in Chinese Patent Application No. 201110038493.4 (with English Translation).

* cited by examiner

BROADCAST RECEIVING APPARATUS AND METHOD OF DETECTING NOISE COMPONENTS PERFORMED BY BROADCAST RECEIVING APPARATUS

CROSS-REFERENCE TO RELATED APPLICATIONS

This application is based upon and claims the benefit of priority of the prior Japanese Patent Application No. 2010-037677, filed on Feb. 23, 2010 and Japanese Patent Application No. 2010-137735, filed on Jun. 16, 2010, the entire contents of which are incorporated herein by reference.

BACKGROUND OF THE INVENTION

1. Field of the Invention

The present invention relates to a broadcast receiving apparatus that receives incoming airwaves such as radio broadcasting and television broadcasting, and a method of detecting noise components performed by a broadcast receiving apparatus.

2. Description of the Related Art

Conventionally, a broadcast receiving apparatus incorporated in a vehicle or the like receives incoming airwaves such as radio broadcasting and television broadcasting, and acoustically outputs a broadcast signal in the received airwaves from an in-vehicle speaker (see, for example, Japanese Patent Application Laid-open No. H8-274663). Further, in a broadcast receiving apparatus, noise components are mixed in a received broadcast signal because a reception environment of airwaves changes with a movement of a vehicle having the broadcast receiving apparatus mounted thereon. Therefore, in conventional broadcast receiving apparatuses, to ensure the listenable or viewable level of broadcast signals for passengers, a function of removing noise components in the broadcast signal has been widely used.

In the case of AM broadcasting, for example, a broadcast receiving apparatus receives incoming airwaves, and performs AM detection on an intermediate frequency signal (hereinafter, simply "IF signal") of the broadcast signal in the received airwaves to acquire an AM detection signal. Next, the broadcast receiving apparatus detects AM noise components based on an AM detection level of the AM detection signal. When there is noise component, the broadcast receiving apparatus removes these noise components from the broadcast signal, and performs a blanking process for performing signal interpolation on a removed section, thereby removing noise components in the broadcast signal. This function has been widely known.

Further, there is another broadcast receiving apparatus that receives AM broadcast airwaves, performs FM detection on an AM broadcast signal in airwaves to acquire an FM detection signal, and extracts FM noise components from frequency fluctuation components in the FM detection signal. Further, there is also known a function of the broadcast receiving apparatus such that when a level of an extracted FM noise components is high, an output level of an AM broadcast signal is decreased, thereby alleviating an influence of noise components in the broadcast signal.

The conventional broadcast receiving apparatus presets a certain AM noise threshold Vtha, and determines whether the AM detection level of the AM detection signal is equal to or higher than the AM noise threshold Vtha. The broadcast receiving apparatus further detects a signal portion equal to or higher than the AM noise threshold Vtha of the AM detection level as an AM noise component.

FIG. 14 is a schematic diagram for explaining an example of an AM detection level with respect to an IF signal. In the AM detection level shown in FIG. 14, for example, four types of reception statuses at a timing t1 to a timing t4 can be assumed. A timing t2 corresponds to a reception status where noise components are actually mixed and it is determined that the AM detection level is equal to or higher than the AM noise threshold Vtha. A timing t3 corresponds to a reception status where noise components are not actually mixed and it is determined that the AM detection level is lower than the AM noise threshold Vtha. The timing t1 corresponds to a reception status where although noise components are actually mixed, the noise component level is low, and it is determined that the AM detection level is lower than the AM noise threshold Vtha. The timing t4 corresponds to a reception status where although noise components are not actually mixed, it is determined that the AM detection level is equal to or higher than the AM noise threshold Vtha due to an influence of modulation components or the like in the AM detection signal.

However, in the conventional broadcast receiving apparatus, because the AM noise threshold Vtha is a fixed value, if the AM noise threshold Vtha is set high, a detection omission of AM noise components occurs, and a broadcast signal is erroneously recognized as a broadcast signal without noise. For example, when the noise component level is low and it is determined that the AM detection level is lower than the AM noise threshold Vtha although noise components are actually mixed, the AM noise components cannot be detected by the conventional broadcast receiving apparatus, although there are noise components. As a result, in the conventional broadcast receiving apparatus, the broadcast signal is erroneously recognized as a broadcast signal without noise, based on a detection result indicating that there is no AM noise component.

Further, in the conventional broadcast receiving apparatus, if the AM noise threshold Vtha is set low, erroneous detection of AM noise components occurs, and a broadcast signal is erroneously recognized as a broadcast signal with noise based on the erroneously detected AM noise components. For example, when it is determined that the AM detection level is equal to or higher than the AM noise threshold Vtha due to an influence of modulation components or the like although noise components are actually not mixed, in the conventional broadcast receiving apparatus, the modulation components equal to or higher than the AM noise threshold Vtha are erroneously detected as AM noise components. As a result, in the conventional broadcast receiving apparatus, the broadcast signal is erroneously recognized as a broadcast signal with noise, based on the erroneously detected AM noise components.

SUMMARY OF THE INVENTION

It is an object of the present invention to at least partially solve the problems in the conventional technology.

According to one aspect of the present invention, a broadcast receiving apparatus includes a receiving unit that receives incoming airwaves, an AM detector that performs AM detection on a broadcast signal in airwaves received by the receiving unit to acquire an AM detection signal, a noise detector for AM detection that detects a signal portion, in which the AM detection signal exceeds a predetermined noise threshold, as a noise component in the AM detection signal, an FM detector that performs FM detection on the broadcast signal to acquire an FM detection signal, and a threshold control unit that changes setting of the predetermined noise threshold in the noise detector for AM detection, based on the FM detection signal acquired by the FM detector.

According to another aspect of the present invention, a method of detecting noise components performed by a broadcast receiving apparatus includes receiving incoming airwaves, performing AM detection on a broadcast signal in airwaves received at the receiving to acquire an AM detection signal, detecting a signal portion, in which the AM detection signal exceeds a predetermined noise threshold, as a noise component in the AM detection signal, performing FM detection on the broadcast signal to acquire an FM detection signal, and changing setting of the predetermined noise threshold in the detecting, based on the FM detection signal acquired in the performing of the FM detection.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Exemplary embodiments of a broadcast receiving apparatus and a method of detecting noise components performed by a broadcast receiving apparatus according to the present invention will be explained below in detail with reference to the accompanying drawings.

Figure 1:
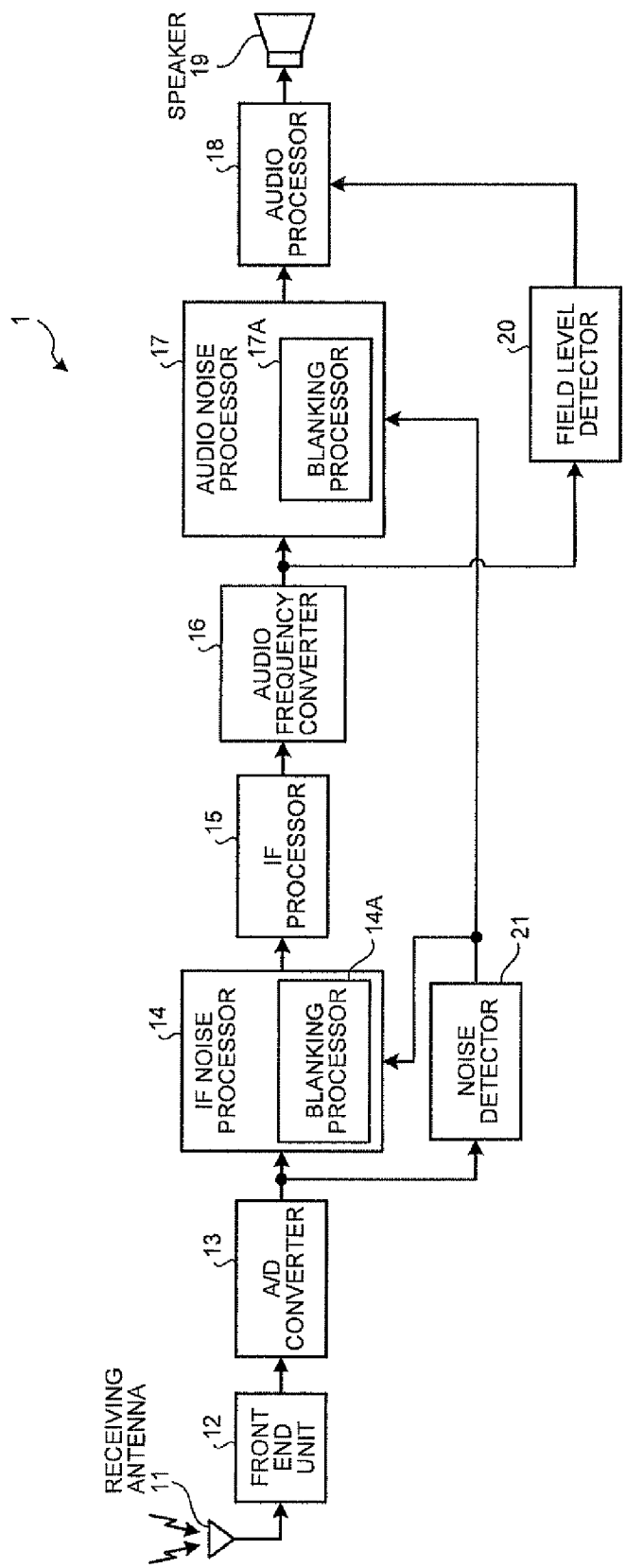
FIG. 1 is a block diagram of an internal configuration of a broadcast receiving apparatus according to a first embodiment of the present invention.

FIG. 1 is a block diagram of a schematic configuration of a broadcast receiving apparatus according to a first embodiment of the present invention. A broadcast receiving apparatus 1 shown in FIG. 1 corresponds to a receiving apparatus such as an AM broadcasting receiver or an FM broadcasting receiver that receives airwaves such as radio broadcasting or television broadcasting. The broadcast receiving apparatus 1 includes a receiving antenna 11, a front end unit 12, an A/D converter 13, an IF noise processor 14, and an IF processor 15. The broadcast receiving apparatus 1 further includes an audio frequency converter 16, an audio noise processor 17, an audio processor 18, a speaker 19, a field level detector 20, and a noise detector 21. Portions such as the A/D converter 13 and its subsequent elements up to the audio processor 18 are constituted of, for example, a digital signal processor (DSP); however, these are not limited to a DSP.

The receiving antenna 11 receives incoming airwaves such as radio broadcasting. The front end unit 12 converts airwaves received by the receiving antenna 11 to an intermediate frequency signal (hereinafter, simply "IF signal"). The A/D converter 13 converts the IF signal to a digital signal. The IF noise processor 14 performs a blanking process for removing noise components in the IF signal. The blanking process corresponds to, for example, interpolation for removing a section to be removed that includes noise components among continuous signal sections of the IF signal, and performing signal interpolation on the removed section. The IF processor 15 performs a digital filtering process on the IF signal having undergone a blanking process. The digital filtering process corresponds to a filtering process for removing an IF signal of a broadcasting frequency adjacent to a broadcasting frequency of the incoming airwaves as a disturbing signal.

The audio frequency converter 16 converts the IF signal having undergone a digital filtering process to an audio frequency signal (hereinafter, simply "audio signal"). The audio noise processor 17 performs a blanking process for removing noise components in the audio signal. The blanking process corresponds to interpolation for removing a section to be removed that includes noise components among continuous signal sections of the audio signal, and performing signal interpolation on the removed section. The IF noise processor 14 performs a blanking process for removing noise components in the broadcast signal in an IF signal stage, whereas the audio noise processor 17 performs a blanking process for removing noise components in the broadcast signal in an audio signal stage in the subsequent stage. That is, the IF noise processor 14 and the audio noise processor 17 remove noise components in two stages, thereby reliably reducing noise components in the broadcast signal. Further, the audio processor 18 performs audio processing on the audio signal. The audio processing corresponds to audio mute processing or high cut processing for removing high-frequency components. The speaker 19 acoustically outputs an audio signal having undergone audio processing.

The field level detector 20 detects a received field level of the IF signal, and inputs the received field level to the audio processor 18. When the received field level is equal to or higher than a predetermined level, the audio processor 18 determines that the currently received field level is good, and performs audio processing corresponding to the excellent received field level. When the received field level is lower than the predetermined level, the audio processor 18 determines that the currently received field level is poor, and performs audio processing such as audio mute processing or high cut processing corresponding to the poorly received field level.

Figure 2:
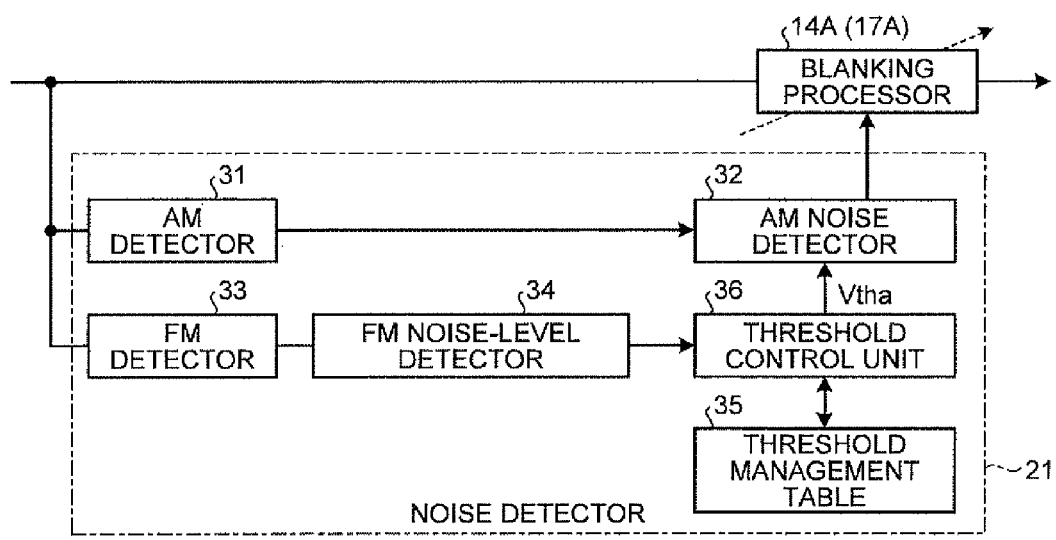
FIG. 2 is a block diagram of an internal configuration of a noise detector according to the first embodiment.

The noise detector 21 detects noise components in the AM detection signal of IF signals sequentially detected via the A/D converter 13. FIG. 2 is a block diagram of an internal configuration of the noise detector 21. FIGS. 3A to 3D are schematic diagrams for explaining a case that respective output signals in the noise detector 21 are expressed based on an analog point of view. For convenience of explanation, respective output signals in the noise detector 21 are explained by an analog waveform. However, needless to say, these are processed digitally in practice.

Figure 3A:
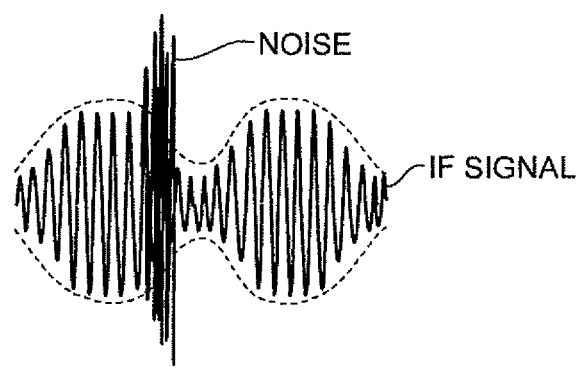
FIGS. 3A to 3D are schematic diagrams for explaining a case that respective output signals in the noise detector are expressed based on an analog point of view.
Figure 3B:
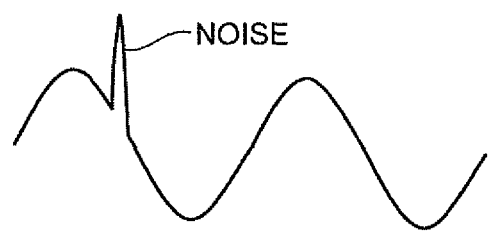
Figure 3C:
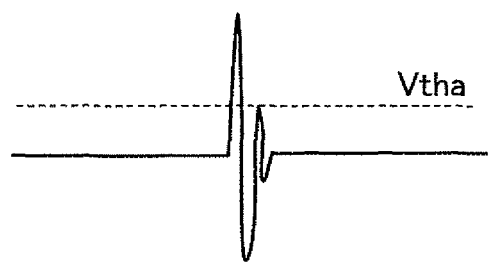

The noise detector 21 shown in FIG. 2 includes an AM detector 31, an AM noise detector 32, an FM detector 33, an FM noise-level detector 34, a threshold management table 35, and a threshold control unit 36. The AM detector 31 performs AM detection on the IF signal shown in FIG. 3A, to acquire an AM detection signal as shown in FIG. 3B. The AM noise detector 32 determines whether an AM detection level of the AM detection signal is equal to or higher than a certain AM noise threshold Vtha, as shown in FIG. 3C. The AM noise detector 32 detects a signal portion equal to or higher than the AM noise threshold Vtha of the AM detection level as an AM noise component in the AM detection signal. When having detected the AM noise components, the AM noise detector 32 outputs a high-level signal to a blanking processor 14A (17A), and when the AM noise detector 32 has not detected the AM noise components, the AM noise detector 32 outputs a low-level signal to the blanking processor 14A (17A).

Figure 3D:
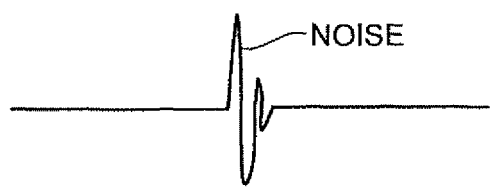

The FM detector 33 performs FM detection on the IF signal, to acquire an FM detection signal as shown in FIG. 3D. Upon detection of the level of the FM noise components in the FM detection signal, the FM noise-level detector 34 informs the threshold control unit 36 of the FM noise level. The FM noise component is generated due to a phase disturbance occurring at the time of noise contamination, regardless of level variation of the AM noise component. Therefore, when the FM noise component is used, for example, the presence of noise components, which cannot be detected by the AM noise detector 32, such as noise components at a timing t1 and a timing t2 in FIG. 5 described later, can be recognized.

Figure 4:
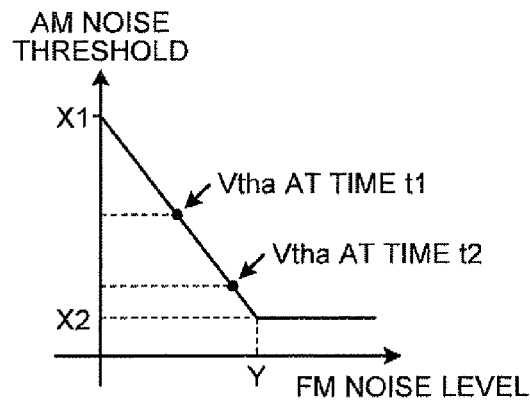
FIG. 4 is a schematic diagram for explaining an example of a table content of a threshold management table.

FIG. 4 is a schematic diagram for explaining a table content of the threshold management table 35. The threshold management table 35 linearly manages the AM noise threshold Vtha corresponding to the FM noise level as shown in FIG. 4. The AM noise threshold Vtha decreases from a maximum value X1 toward a minimum value X2 with an increase of the FM noise level, with a predetermined range from the maximum value X1 to the minimum value X2 being set. When the FM noise level exceeds a threshold level Y, the AM noise threshold Vtha stays at the minimum value X2.

Figure 5:
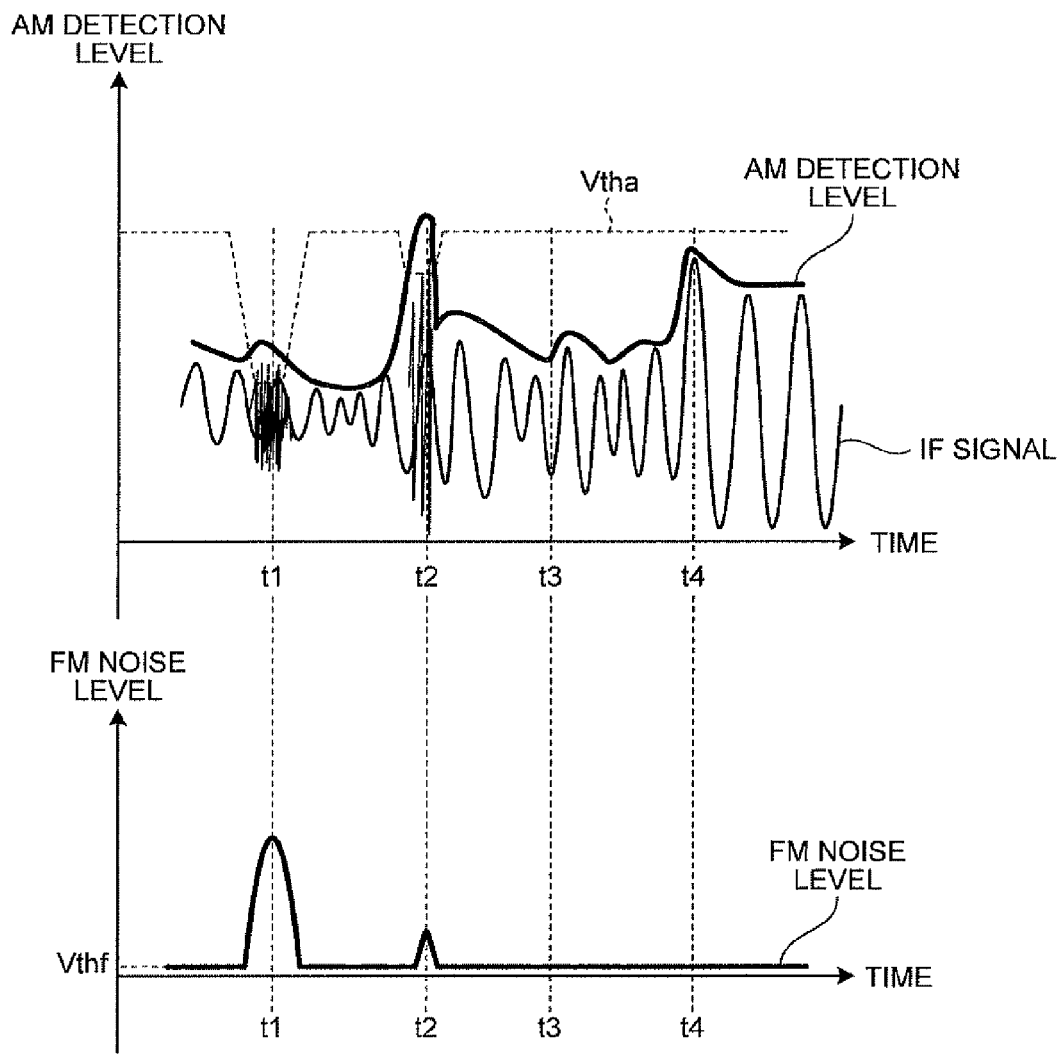
FIG. 5 is a schematic diagram for explaining transition of a setting change of an AM noise threshold corresponding to an FM noise level.

FIG. 5 is a schematic diagram for explaining transition of a setting change of the AM noise threshold Vtha corresponding to the FM noise level. The timing t1 corresponds to a reception status where the AM noise components are less than the modulation components in the AM detection signal. The timing t2 corresponds to a reception status having large AM noise components. The timing t3 corresponds to a reception status having substantially no AM noise component. The timing t4 corresponds to a reception status where although there is no AM noise component, the modulation components in the AM detection signal are large.

The threshold control unit 36 normally sets a high AM noise threshold Vtha in the AM noise detector 32 as shown in FIG. 5.

Upon detection of the FM noise level by the FM noise-level detector 34 at the timing t1, the threshold control unit 36 determines that there are noise components, and reads an AM noise threshold Vtha corresponding to the FM noise level from the threshold management table 35. The threshold control unit 36 changes the setting of the AM noise threshold Vtha in the AM noise detector 32 to the read AM noise threshold Vtha. That is, the threshold control unit 36 decreases the AM noise threshold Vtha corresponding to the FM noise level to increase detection sensitivity of the AM noise components by the AM noise detector 32. As a result, because the AM detection level at the timing t1 becomes higher than the AM noise threshold Vtha, the AM noise detector 32 can detect the AM noise components, which cannot be detected according to the conventional technique.

Upon detection of the FM noise level by the FM noise-level detector 34 at the timing t2, the threshold control unit 36 determines that there are noise components, and reads an AM noise threshold Vtha corresponding to the FM noise level from the threshold management table 35. The threshold control unit 36 changes setting of the AM noise threshold in the AM noise detector 32 to the read AM noise threshold Vtha. That is, the threshold control unit 36 decreases the AM noise threshold Vtha corresponding to the FM noise level to increase detection sensitivity of the AM noise components by the AM noise detector 32. As a result, because the AM detection level at the timing t2 becomes higher than the AM noise threshold Vtha, the AM noise detector 32 can prevent a detection omission of the AM noise components, even if the normal AM noise threshold Vtha is increased.

Because the threshold control unit 36 does not detect the FM noise level by the FM noise-level detector 34 at the timing t3, the threshold control unit 36 determines that there is no noise component, and sets the normal AM noise threshold Vtha as the AM noise threshold Vtha in the AM noise detector 32. Because the threshold control unit 36 sets a high AM noise threshold Vtha as the normal AM noise threshold Vtha, detection sensitivity of the AM noise components by the AM noise detector 32 is decreased. As a result, because the AM detection level at the timing t3 becomes less than the AM noise threshold, the AM noise detector 32 can determine that there is no AM noise component.

Because the threshold control unit 36 does not detect the FM noise level of the FM noise-level detector 34 at the timing t4, the threshold control unit 36 determines that there is no noise component, and sets the normal AM noise threshold Vtha as the AM noise threshold Vtha in the AM noise detector 32. Even when there is no noise contamination and the modulation components in the AM detection signal increase, the threshold control unit 36 sets a higher normal AM noise threshold Vtha. As a result, because the AM detection level at the timing t4 is less than the AM noise threshold, the AM noise detector 32 determines that there is no AM noise component, and erroneous detection of noise due to an increase of the modulation components as in the conventional technique can be reliably prevented.

The AM noise detector 32 determines whether the AM detection level of the AM detection signal is equal to or higher than the set AM noise threshold Vtha, and detects a signal portion equal to or higher than the AM noise threshold Vtha as an AM noise component. When there are AM noise components, the AM noise detector 32 transmits a high-level signal indicating that there are AM noise components to the blanking processor 14A (17A). Further, the AM noise detector 32 detects that a signal portion lower than the AM noise threshold Vtha includes no AM noise component, and transmits a low-level signal indicating that there is no AM noise component to the blanking processor 14A (17A).

Figure 6:
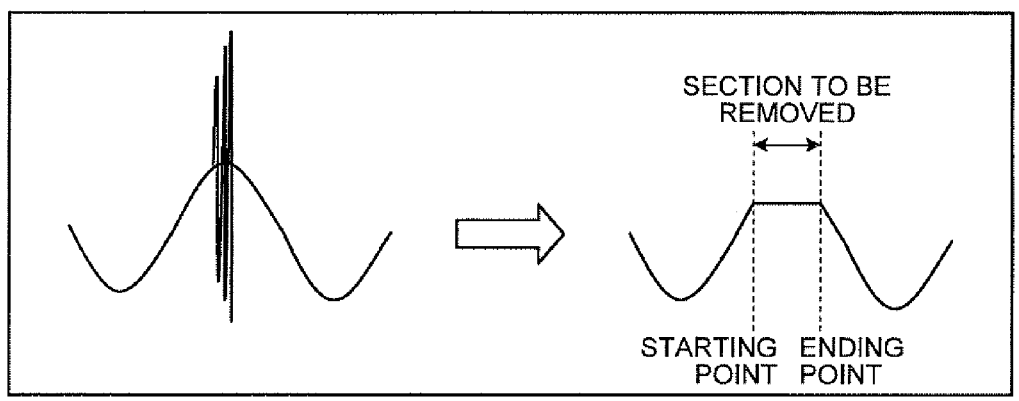
FIG. 6 is a schematic diagram for explaining a processing content of a blanking processor.

FIG. 6 is a schematic diagram for explaining a processing content of the blanking processor 14A. Upon detection of the high-level signal indicating that there are AM noise components from the AM noise detector 32, the blanking processor 14A performs a blanking process on the IF signal. In the blanking process, a section to be removed that includes noise components among continuous signal sections of the IF signal is removed and signal interpolation is performed on the removed section. For the signal interpolation, linear interpolation for linearly performing signal interpolation between a starting point and an ending point of the section to be removed is adopted. Upon detection of the low-level signal indicating that there is no AM noise component from the AM noise detector 32, the blanking processor 14A prohibits execution of the blanking process on the IF signal.

Upon detection of the high-level signal indicating that there are AM noise components from the AM noise detector 32, the blanking processor 17A of the audio noise processor 17 performs the blanking process on the audio signal. In the blanking process of audio signal, a section to be removed that includes noise components among continuous signal sections of the audio signal is removed and signal interpolation is performed linearly on the removed section. Upon detection of the low-level signal indicating that there is no AM noise component from the AM noise detector 32, the blanking processor 17A prohibits execution of the blanking process on the audio signal.

Figure 7:
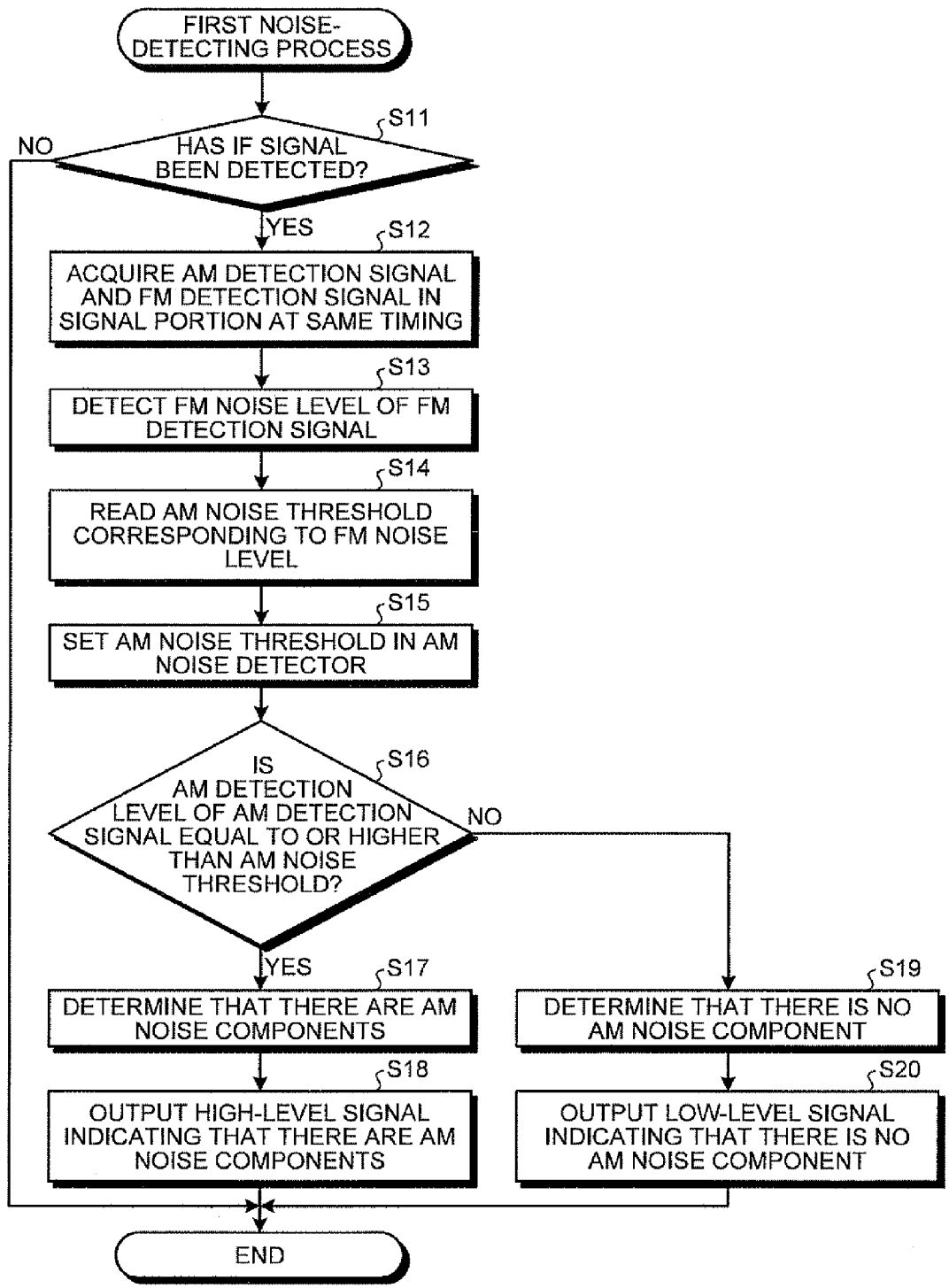
FIG. 7 is a flowchart of a processing operation performed in the noise detector related to a first noise-detecting process.

An operation of the broadcast receiving apparatus 1 according to the first embodiment is explained next. FIG. 7 is a flowchart of a processing operation performed in the noise detector 21 related to a first noise-detecting process. In the first noise-detecting process illustrated in FIG. 7, detection sensitivity of AM noise components is controlled by changing setting of the AM noise threshold Vtha in the AM noise detector 32 according to the FM noise level to detect the presence of AM noise components in the broadcast signal.

In FIG. 7, the AM detector 31 and the FM detector 33 in the noise detector 21 determine whether an IF signal via the A/D converter 13 is detected (Step S11). When detecting an IF signal (YES at Step S11), the AM detector 31 and the FM detector 33 acquire an AM detection signal and an FM detection signal in a signal portion of the IF signal at the same timing (Step S12). The FM noise-level detector 34 in the noise detector 21 detects an FM noise level of an FM detection signal (Step S13).

Upon detection of the FM noise level, the threshold control unit 36 in the noise detector 21 reads the AM noise threshold Vtha corresponding to the FM noise level from the threshold management table 35 (Step S14), and sets the read AM noise threshold Vtha as the AM noise threshold Vtha in the AM noise detector 32 (Step S15).

The AM noise detector 32 in the noise detector 21 determines whether the AM detection level of the AM detection signal is equal to or higher than the AM noise threshold Vtha (Step S16). When the AM detection level is equal to or higher than the AM noise threshold Vtha (YES at Step S16), the AM noise detector 32 determines that there are AM noise components (Step S17). The AM noise detector 32 outputs a high-level signal indicating that there are AM noise components to the blanking processors 14A and 17A (Step S18), and finishes the processing operation shown in FIG. 7.

When the AM detection level is not equal to or higher than the AM noise threshold Vtha (NO at Step S16), the AM noise detector 32 determines that there is no AM noise component (Step S19). The AM noise detector 32 outputs a low-level signal indicating that there is no AM noise component to the blanking processors 14A and 17A (Step S20), and finishes the processing operation shown in FIG. 7. When an IF signal is not detected (NO at Step S11), the AM detector 31 and the FM detector 33 finish the processing operation shown in FIG. 7.

In the first noise-detecting process shown in FIG. 7, when an FM noise level of an FM detection signal is detected, an AM noise threshold Vtha corresponding to the FM noise level is read from the threshold management table 35, and the read AM noise threshold Vtha is set as the AM noise threshold Vtha in the AM noise detector 32. As a result, a detection omission of AM noise components which can occur when a higher AM noise threshold Vtha is set as in the conventional method can be reliably prevented, and erroneous detection of AM noise components which can occur when a lower AM noise threshold Vtha is set can be reliably prevented.

In the first embodiment, when an FM noise level of an FM detection signal is detected, the AM noise threshold Vtha corresponding to the FM noise level is read from the threshold management table 35, and the read AM noise threshold Vtha is set as the AM noise threshold Vtha in the AM noise detector 32. As a result, a detection omission of AM noise components which can occur when a higher AM noise threshold Vtha is set as in the conventional method can be reliably prevented, and erroneous detection of AM noise components which can occur when a lower AM noise threshold Vtha is set can be reliably prevented.

Further, in the first embodiment, when the AM noise threshold Vtha in the AM noise detector 32 for determining the presence of AM noise components in the AM detection signal is to be set or changed, the FM noise level of the FM detection signal, which cannot be recognized only by the AM detection signal, is used. As a result, for example, a detection omission of a small amount of AM noise components that cannot be recognized only by the AM detection signal and erroneous detection of AM noise components due to a large amount of modulation components can be reliably prevented. That is, the presence of noise in a broadcast signal corresponding to a reception environment can be recognized highly accurately.

In the first embodiment, when an FM noise level is detected, an AM noise threshold Vtha corresponding to the FM noise level is read from the one threshold management table 35. However, in the broadcast receiving apparatus 1, the reception environment largely changes with a movement of the vehicle having the broadcast receiving apparatus 1 incorporated therein. As a result, the AM noise threshold Vtha corresponding to the FM noise level needs to be changed according to a change in the reception environment.

Figure 8:
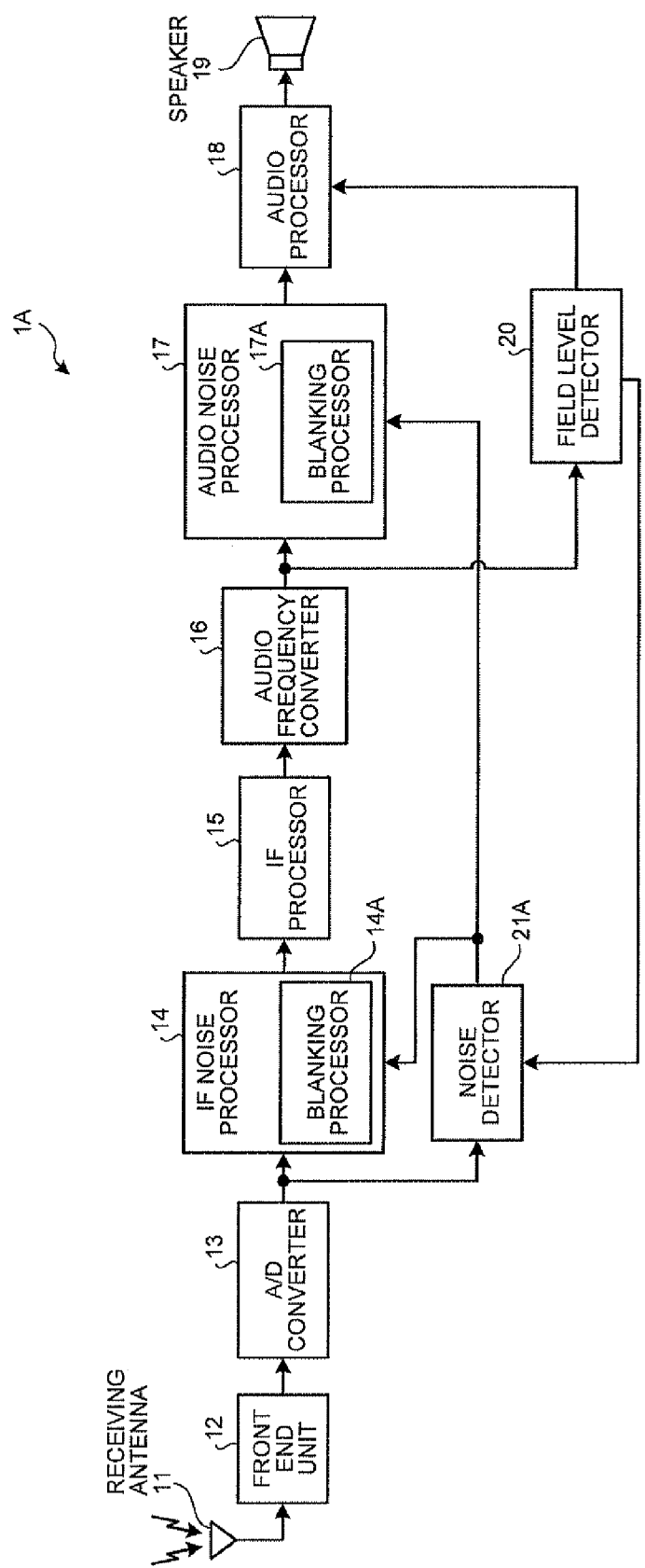
FIG. 8 is a block diagram of an internal configuration of a broadcast receiving apparatus according to a second embodiment of the present invention.
Figure 9:
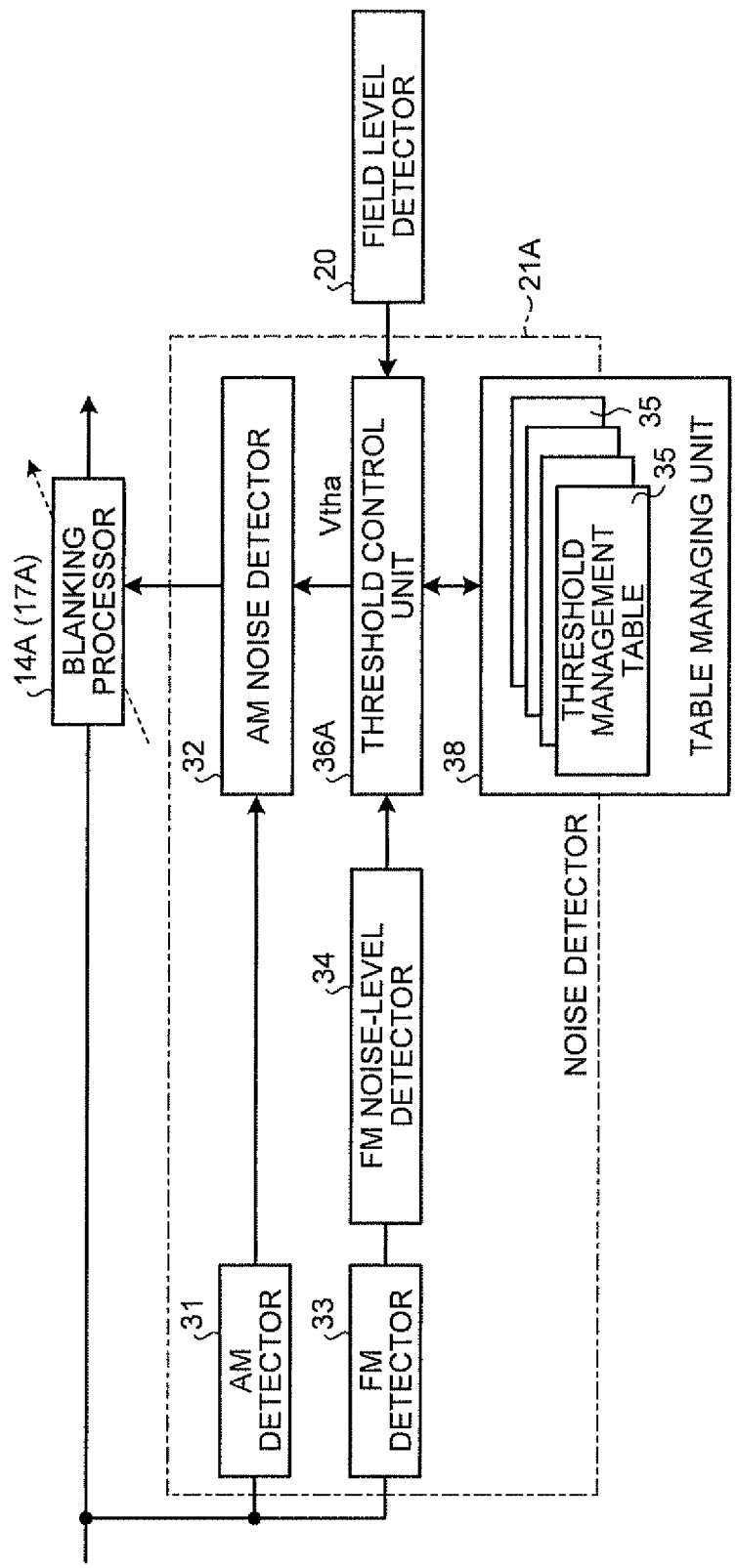
FIG. 9 is a block diagram of an internal configuration of a noise detector according to the second embodiment.

To handle such a situation, another embodiment of the broadcast receiving apparatus is explained as a second embodiment of the present invention. FIG. 8 is a block diagram of an internal configuration of a broadcast receiving apparatus according to the second embodiment, and FIG. 9 is a block diagram of an internal configuration of a noise detector according to the second embodiment. Constituent elements identical to those of the broadcast receiving apparatus 1 according to the first embodiment are denoted by like reference numerals and redundant explanations of the configurations and operations thereof will be omitted.

A broadcast receiving apparatus 1A according to the second embodiment differs from the broadcast receiving apparatus 1 according to the first embodiment in that the threshold management table 35 is not only one, and a plurality of threshold management tables 35 corresponding to the received field levels of airwaves are provided.

A noise detector 21A includes a table managing unit 38 that manages the threshold management tables 35. The table managing unit 38 manages the threshold management table 35 corresponding to the received field level, for each received field level.

Upon detection of an FM noise level from the FM noise-level detector 34, a threshold control unit 36A selects the threshold management table 35 corresponding to the currently received field level detected by the field level detector 20 from the table managing unit 38. Upon selection of the threshold management table 35, the threshold control unit 36A reads an AM noise threshold Vtha corresponding to the FM noise level from the selected threshold management table 35, and sets the read AM noise threshold Vtha as the AM noise threshold Vtha in the AM noise detector 32.

Figure 10:
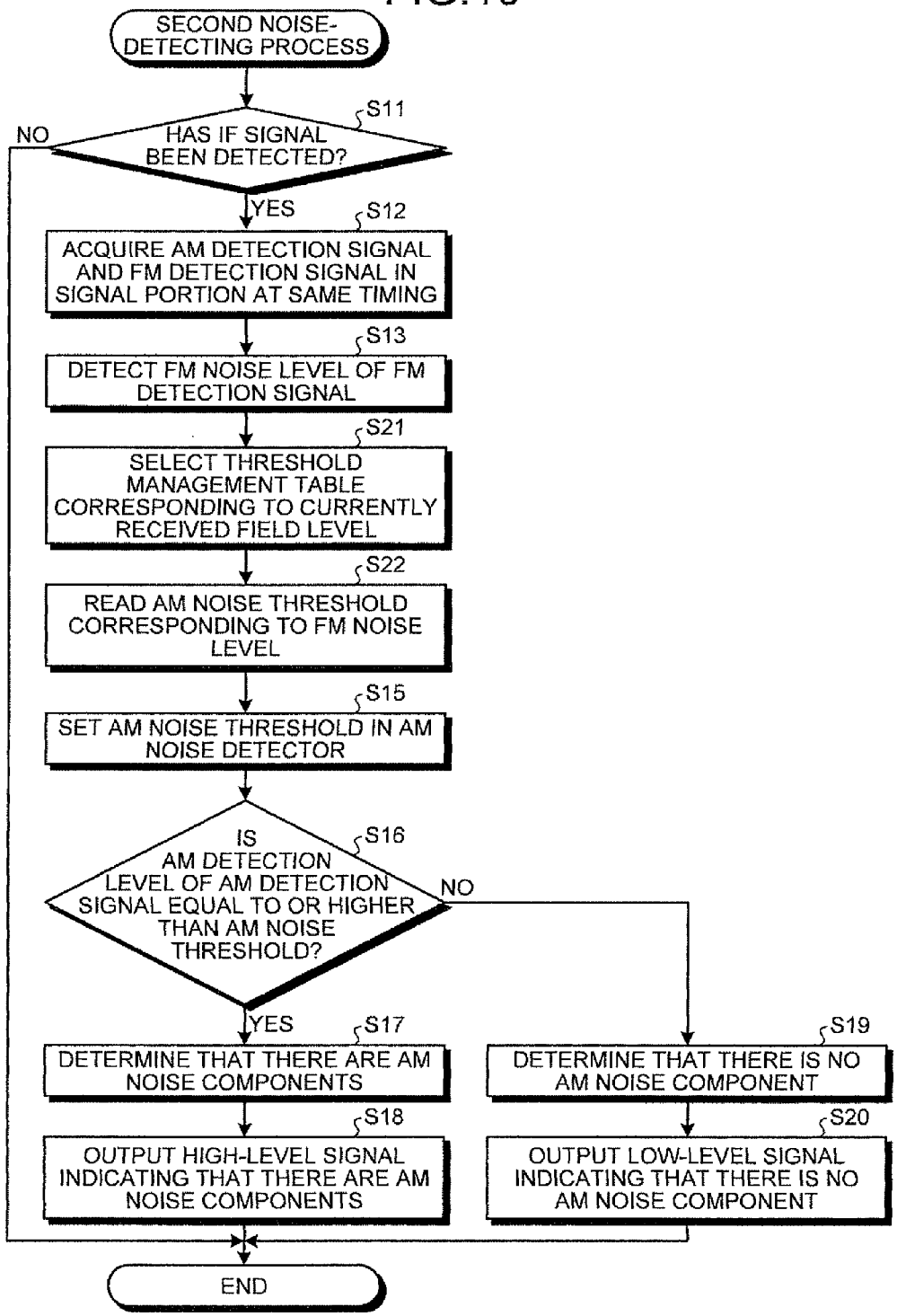
FIG. 10 is a flowchart of a processing operation in the noise detector related to a second noise-detecting process.

An operation of the broadcast receiving apparatus 1A according to the second embodiment is explained next. FIG. 10 is a flowchart of a processing operation performed by the noise detector 21A related to a second noise-detecting process according to the second embodiment.

In the second noise-detecting process shown in FIG. 10, setting of an AM noise threshold Vtha in the AM noise detector 32 is changed according to the FM noise level by using the threshold management table 35 corresponding to the currently received field level to control the detection sensitivity of AM noise components, thereby detecting the presence of AM noise components in the broadcast signal.

In FIG. 10, upon detection of the FM noise level of the FM detection signal at Step S13, the threshold control unit 36A in the noise detector 21A selects the threshold management table 35 corresponding to the currently received field level from the table managing unit 38 (Step S21). The threshold control unit 36A detects the received field level of a broadcast signal currently being received via the field level detector 20. Upon selection of the threshold management table 35 corresponding to the currently received field level, the threshold control unit 36A reads an AM noise threshold Vtha corresponding to the FM noise level from the selected threshold management table 35 (Step S22). The threshold control unit 36A proceeds to Step S15 to set the read AM noise threshold Vtha as the AM noise threshold Vtha in the AM noise detector 32.

In the second noise-detecting process shown in FIG. 10, when the FM noise level of the FM detection signal is detected, the threshold management table 35 corresponding to the currently received field level is selected, and the AM noise threshold Vtha corresponding to the FM noise level is read from the threshold management table 35. Further, in the second noise-detecting process, the read AM noise threshold Vtha is set as the AM noise threshold Vtha in the AM noise detector 32. As a result, a detection omission of AM noise components which can occur when a higher AM noise threshold Vtha is set as in the conventional method can be reliably prevented, and erroneous detection of AM noise components which can occur when a lower AM noise threshold Vtha is set can be reliably prevented, by using the threshold management table 35 suitable for the current reception environment.

In the second embodiment, when the FM noise level of the FM detection signal is detected, the threshold management table 35 corresponding to the currently received field level is selected, and the AM noise threshold Vtha corresponding to the FM noise level is read from the threshold management table 35. Further, in the second noise-detecting process, the read AM noise threshold Vtha is set as the AM noise threshold Vtha in the AM noise detector 32. As a result, a detection omission of AM noise components can be reliably prevented when a higher AM noise threshold Vtha is set as in the conventional method, and erroneous detection of AM noise components can be reliably prevented when a lower AM noise threshold Vtha is set, by using the threshold management table 35 suitable for the current reception environment.

In a broadcasting station that transmits airwaves, airwaves may be over-modulated and transmitted in order to expand its service area. Here, "over-modulation" refers to a state where a modulation factor of airwaves exceeds a specified value (specifically, 100%).

The broadcast receiving apparatuses 1 & 1A according to the first and second embodiments have such a problem that when over-modulated airwaves are input, AM noise can be erroneously detected, although actually there is no noise component, thereby causing audio distortion.

Figure 11:
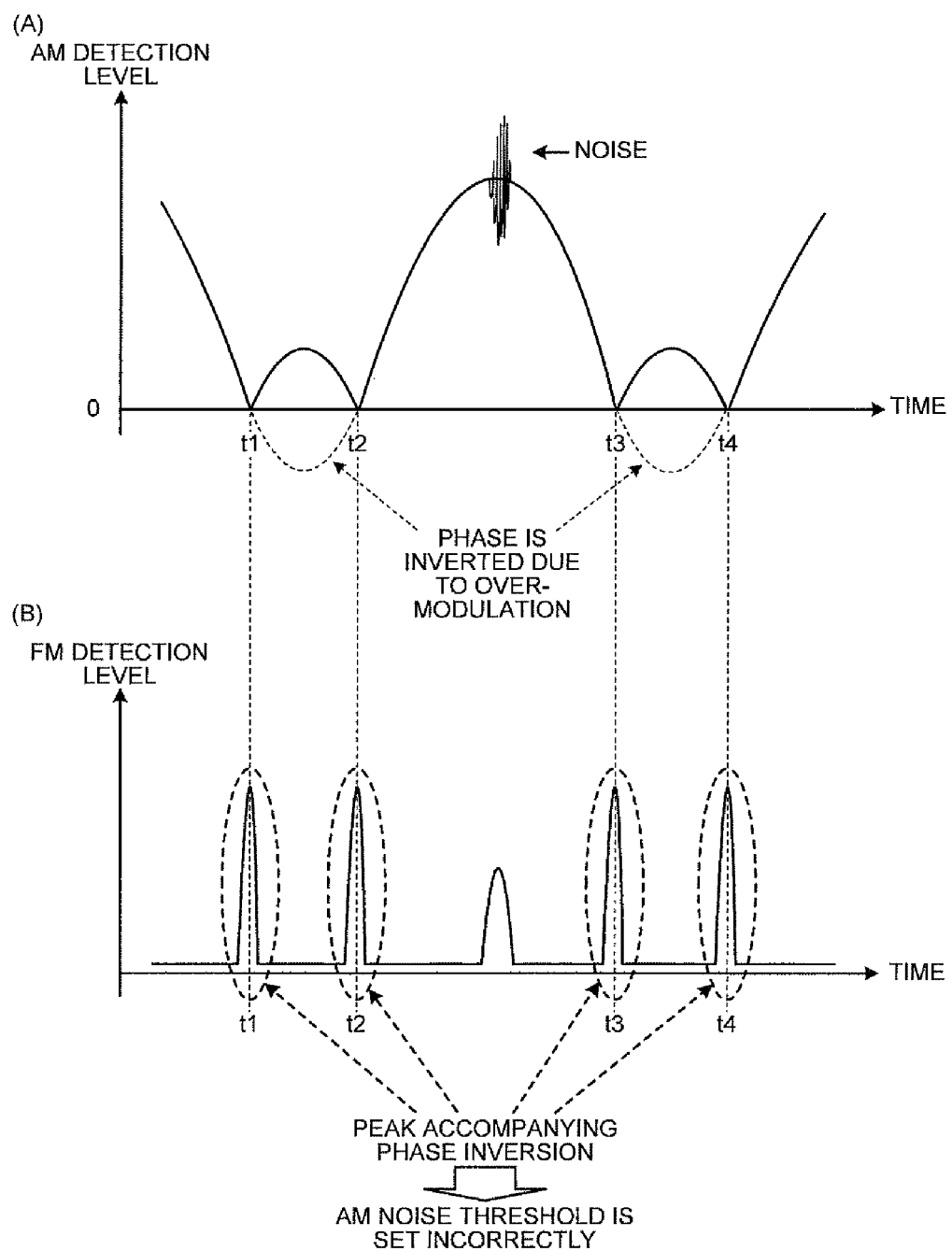
FIG. 11 is a schematic diagram for explaining a problem when over-modulated airwaves are received.

This problem is specifically explained with reference to FIG. 11. FIG. 11 is a schematic diagram for explaining a problem when over-modulated airwaves are received. (A) in FIG. 11 is an example of an AM detection signal including over-modulated airwaves, and (B) in FIG. 11 depicts an FM detection signal corresponding to the AM detection signal shown in (A) in FIG. 11.

As shown in (A) in FIG. 11, in a section where over-modulated airwaves are received, the phase of an AM detection signal is inverted. For example, in (A) in FIG. 11, over-modulated airwaves are input in a period between a time t1 and a time t2 and a period between a time t3 and a time t4. In this case, the phase of the AM detection signal is inverted about an AM detection level "0" in the period between the time t1 and the time t2 and the period between the time t3 and the time t4.

When phase inversion occurs in the AM detection signal, the AM detection level changes abruptly. As a result, as shown in (B) in FIG. 11, a peak appears about the timing at which the phase is inverted (here, the times t1 to t4) in the FM detection signal. The threshold control unit 36 sets the AM noise threshold corresponding to the levels of these peaks for the AM noise detector 32 (see FIG. 4).

As a result, because the AM noise detector 32 detects AM noise by using the AM noise threshold set lower than normal, the AM noise detector 32 may erroneously detect AM noise, although actually there is no noise component. When erroneous detection of AM noise occurs, the blanking processors 14A and 17A perform the blanking process, thereby causing audio distortion. Therefore, in a third embodiment of the present invention, occurrence of audio distortion is suppressed by preventing erroneous detection of AM noise.

Figure 12:
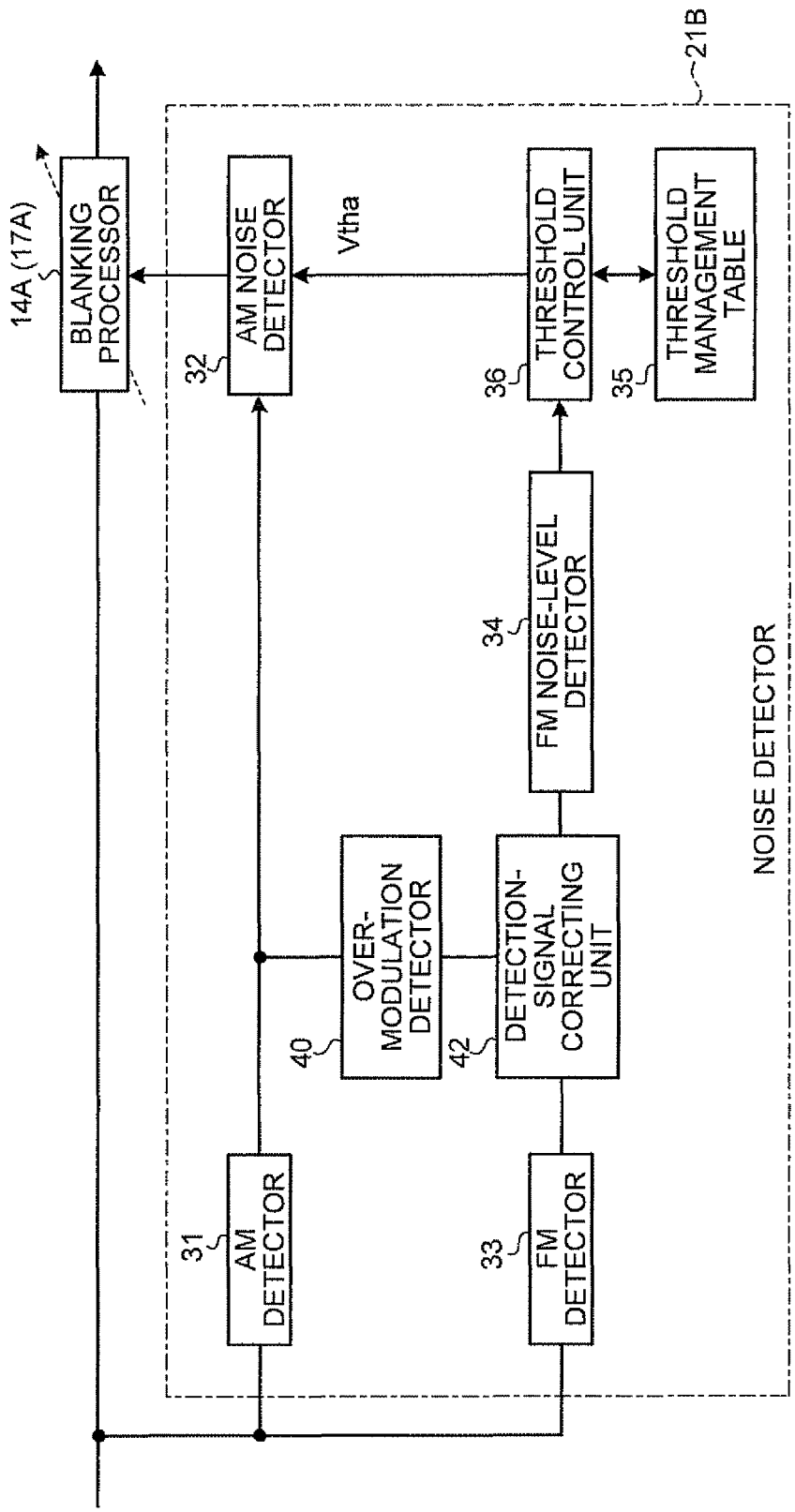
FIG. 12 is a block diagram of an internal configuration of a noise detector according to a third embodiment of the present invention.

FIG. 12 is a block diagram of an internal configuration of a noise detector 21B according to the third embodiment. Constituent elements identical to those of the noise detector 21 according to the first embodiment are denoted by like reference numerals and redundant explanations of the configurations and operations thereof will be omitted.

As shown in FIG. 12, the noise detector 21B according to the third embodiment further includes an over-modulation detector 40 and a detection-signal correcting unit 42. The over-modulation detector 40 receives an AM detection signal from the AM detector 31, and detects the presence of over-modulation based on the AM detection level of the received AM detection signal.

Specifically, the over-modulation detector 40 detects the presence of over-modulation by detecting an inversion timing of the AM detection signal, that is, the timing at which the AM detection level becomes "0". Upon detection of the timing at which the AM detection level becomes "0", the over-modulation detector 40 outputs such a detection result to the detection-signal correcting unit 42.

In the following explanations, the timing at which the AM detection level becomes "0" is referred to as "zero point". In the case shown in (A) in FIG. 11, the time t1 to the time t4 respectively correspond to the zero point.

The detection-signal correcting unit 42 corrects the FM detection level of an FM detection signal detected by the FM detector 33 based on a detection result of over-modulation detected by the over-modulation detector 40.

Specifically, when the detection result of the zero point is input from the over-modulation detector 40, the detection-signal correcting unit 42 multiplies the FM detection level of the FM detections signal detected in a predetermined period including a zero point by "0" to correct the FM detection level of the FM detection signal to "0". According to such correction, a peak about the zero point, which causes erroneous detection of AM noise, is removed.

If an FM detection signal output from the FM detector 33 is corrected in real time, erroneous detection of AM noise may not be appropriately prevented. This is because a peak about a zero point, which causes erroneous detection of AM noise, starts to appear from a timing before the zero point (see (B) in FIG. 11).

Therefore, the detection-signal correcting unit 42 holds the FM detection signal output from the FM detector 33 for a certain period of time to correct the FM detection signal eventually, in order to remove the peak about the zero point appropriately.

The detection-signal correcting unit 42 also outputs a corrected detection signal to the FM noise-level detector 34.

Figure 13:
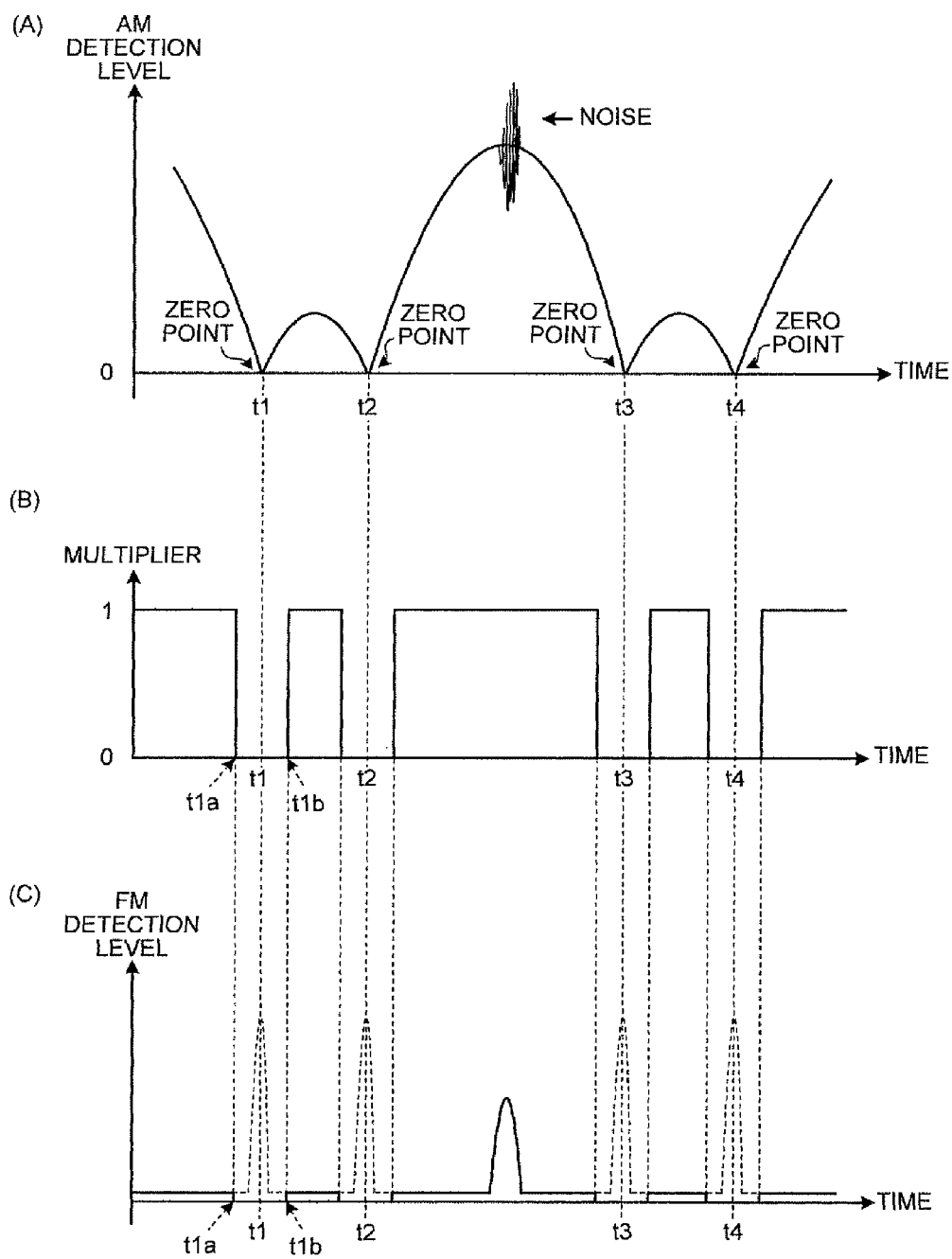
FIG. 13 is an operation example of an over-modulation detector and a detection-signal correcting unit.
Figure 14:
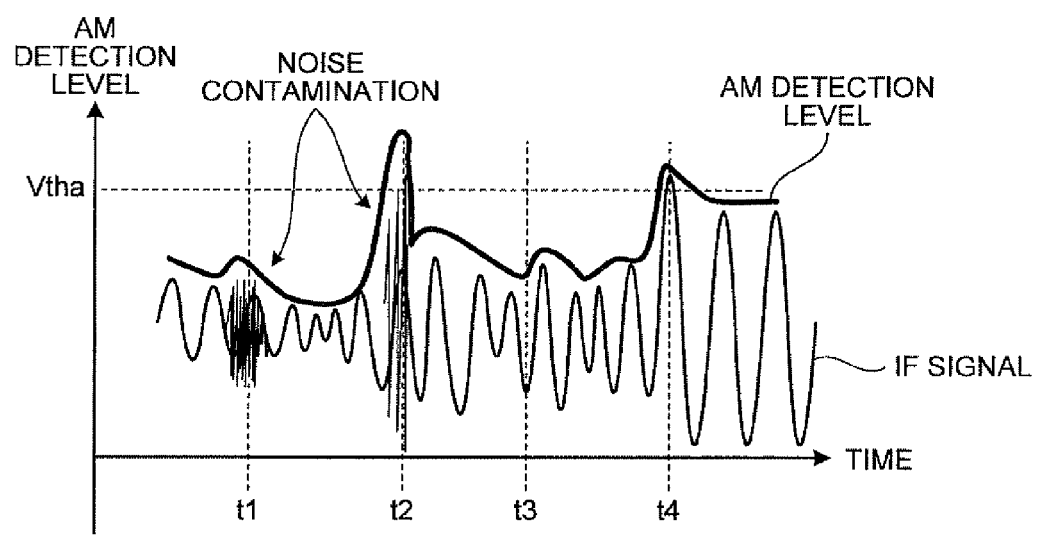
FIG. 14 is a schematic diagram for explaining the presence of noise components in an AM detection level with respect to an IF signal.

An operation example of the over-modulation detector 40 and the detection-signal correcting unit 42 is explained with reference to FIG. 13. FIG. 13 is an operation example of the over-modulation detector 40 and the detection-signal correcting unit 42. The AM detection signal shown in (A) in FIG. 13 is the same as the AM detection signal shown in (A) in FIG. 11. As shown in (A) in FIG. 13, the over-modulation detector 40 detects the time t1 to the time t4, which are zero points in the AM detection signal, and outputs a detection result to the detection-signal correcting unit 42.

As shown in (B) in FIG. 13, the detection-signal correcting unit 42 multiplies the FM detection level of the FM detection signal detected in a predetermined period about the zero point by "0". For example, when zero point t1 is detected, the detection-signal correcting unit 42 multiplies the FM detection level of the FM detection signal detected in a period of from a time t1*a* to a time t1*b* about the zero point t1 by "0".

Accordingly, as shown in (C) in FIG. 13, the FM detection level of the FM detection signal detected in the predetermined period about the zero point becomes "0", thereby enabling to remove a peak about the zero point, which causes erroneous detection of AM noise.

As described above, erroneous detection of AM noise can be prevented by removing a peak about the zero point from the FM detection signal detected in a predetermined period including the timing at which the phase of the AM detection signal is inverted. As a result, no blanking process is performed in a section in which there is actually no noise component, and thus occurrence of audio distortion can be suppressed.

An example in which a peak about a zero point is removed by multiplying the FM detection signal by a predetermined multiplier is explained here; however, the present invention is not limited thereto. For example, the detection-signal correcting unit 42 can replace the FM detection level of the FM detection signal detected in a period about a zero point by a preset value.

When the preset value is "0", the result will be same as that obtained when the FM detection signal is multiplied by "0". However, when a steady-state value of the FM detection level is larger than "0" and if the FM detection level is replaced by "0", the AM noise threshold may be set higher than normal by the threshold control unit 36. In such a case, therefore, by using a steady-state value of the FM detection level as the preset value, the threshold control unit 36 can set the AM noise threshold more appropriately.

As described above, in the third embodiment, the over-modulation detector detects the timing at which the phase of the AM detection signal is inverted, and the FM detection-signal correcting unit corrects the FM detection level of the FM detection signal detected in a predetermined period including the timing detected by the over-modulation detector. Therefore, erroneous detection of AM noise can be prevented, and thus occurrence of audio distortion can be suppressed.

In the embodiments as described above, a blanking process is performed by using the blanking processor 14A in the IF noise processor 14 and the blanking processor 17A in the audio noise processor 17. However, a blanking process can be performed by using only one blanking processor 14A (17A) in the IF noise processor 14 or the audio noise processor 17, and in this case, only one blanking processor is required. Further, in the embodiments, linear interpolation for linearly performing signal interpolation between the starting point and the ending point of the section to be removed is explained as an example of the blanking process. However, pre-interpolation can be adopted to interpolate the starting point and the ending point of the section to be removed by using a signal immediately before the removed noise component.

Similarly, linear prediction interpolation can be adopted in such a manner that histories of sequentially detected IF signals are retained, a signal portion approximating a signal portion at the normal time of the section to be removed is read from the retained histories of the IF signals, and the starting point and the ending point of the section to be removed are interpolated by using the read signal portion.

Further, in the respective embodiments described above, a blanking process is adopted at the time of removing noise components in an IF signal (audio signal). Needless to say, however, the same effect can be obtained even by adopting other processing methods for removing noise components.

While a radio receiver has been explained as an example in the respective embodiments, a television receiver can be also adopted in these embodiments.

Respective constituent elements of respective units shown in the drawings do not necessarily have to be physically configured in the way as shown in these drawings. That is, the specific mode of distribution and integration of respective units is not limited to the shown ones, and all or a part of these units can be functionally or physically distributed or integrated in an arbitrary unit, according to various kinds of load and the status of use.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A broadcast receiving apparatus comprising:
    a receiving unit that receives incoming airwaves;
    an AM detector that performs AM detection on a broadcast signal in airwaves received by the receiving unit to acquire an AM detection signal;
    a noise detector for AM detection that detects a signal portion, in which the AM detection signal exceeds a predetermined noise threshold, as a noise component in the AM detection signal;

an FM detector that performs FM detection on the broadcast signal to acquire an FM detection signal; and a threshold control unit that changes setting of the predetermined noise threshold in the noise detector for AM detection, based on the FM detection signal acquired by the FM detector.

2. The broadcast receiving apparatus according to claim 1, wherein when the FM detector acquires the FM detection signal, the threshold control unit changes setting of the predetermined noise threshold in the noise detector for AM detection that compares the FM detection signal with an AM detection signal in a same signal portion, based on the FM detection signal.

3. The broadcast receiving apparatus according to claim 1, further comprising:

a noise level detector for FM detection that detects a noise level of the FM detection signal; and a threshold management table for managing a noise threshold corresponding to the noise level, for each noise level of the FM detection signal, wherein when the noise level detector for FM detection detects a noise level of the FM detection signal, the threshold control unit reads a noise threshold corresponding to the noise level of the FM detection signal from the threshold management table, and sets a read noise threshold as the predetermined noise threshold in the noise level detector for AM detection.

4. The broadcast receiving apparatus according to claim 1, further comprising:

a noise level detector for FM detection that detects a noise level of the FM detection signal;

a received field-level detector that detects a received field level of the broadcast signal; and a table managing unit that manages a threshold management table corresponding to the received field level, for each received field level of the broadcast signal, wherein when the noise level detector for FM detection detects a noise level of the FM detection signal, the threshold control unit selects a threshold management table corresponding to a currently received field level of a broadcast signal detected by the received field-level detector from the table managing unit, reads a noise threshold corresponding to a noise level of the FM detection signal from the selected threshold management table, and sets a read noise threshold as the predetermined noise threshold in the noise detector for AM detection.

5. The broadcast receiving apparatus according to claim 1, further comprising:

a noise reducing unit that performs noise reduction for reducing noise components in the broadcast signal on the broadcast signal; and a control unit that controls the noise reducing unit based on a noise component in the AM detection signal detected by the noise detector for AM detection.

6. The broadcast receiving apparatus according to claim 3, further comprising:

a timing detector that detects a timing at which a phase of the AM detection signal is inverted; and an FM-detection-signal correcting unit that corrects a noise level of an FM detection signal detected in a predetermined period including a timing detected by the timing detector, wherein the noise level detector for FM detection detects a noise level of an FM detection signal corrected by the FM-detection-signal correcting unit.

7. A method of detecting noise components performed by a broadcast receiving apparatus, the method comprising:

receiving incoming airwaves;

performing AM detection on a broadcast signal in airwaves received at the receiving to acquire an AM detection signal;

detecting a signal portion, in which the AM detection signal exceeds a predetermined noise threshold, as a noise component in the AM detection signal;

performing FM detection on the broadcast signal to acquire an FM detection signal; and changing setting of the predetermined noise threshold in the detecting, based on the FM detection signal acquired in the performing of the FM detection.

* * * * *